United States Patent
Tel et al.

(10) Patent No.: US 11,599,027 B2
(45) Date of Patent: Mar. 7, 2023

(54) LITHOGRAPHIC PROCESS AND APPARATUS AND INSPECTION PROCESS AND APPARATUS

(71) Applicant: ASML NETHERLANDS B.V., Veldhoven (NL)

(72) Inventors: Wim Tjibbo Tel, Helmond (NL); Hans Erik Kattouw, Arnhem (NL); Valerio Altini, Eindhoven (NL); Bearrach Moest, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 17/520,803

(22) Filed: Nov. 8, 2021

(65) Prior Publication Data

US 2022/0057719 A1    Feb. 24, 2022

Related U.S. Application Data

(63) Continuation of application No. 16/468,304, filed as application No. PCT/EP2017/080002 on Nov. 22, 2017, now Pat. No. 11,199,782.

(30) Foreign Application Priority Data

Dec. 30, 2016   (EP) ..................................... 16207472

(51) Int. Cl.
   *G03F 7/20*     (2006.01)
   *G03F 9/00*     (2006.01)

(52) U.S. Cl.
   CPC ...... *G03F 7/70525* (2013.01); *G03F 7/70425* (2013.01); *G03F 7/70558* (2013.01); *G03F 7/70725* (2013.01); *G03F 9/7026* (2013.01)

(58) Field of Classification Search
   CPC ............ G03F 7/70525; G03F 7/70425; G03F 7/70558; G03F 7/70725; G03F 9/7026
   See application file for complete search history.

(56) References Cited

U.S. PATENT DOCUMENTS

| | | |
|---|---|---|
| 2003/0018948 A1 | 1/2003 | Chang |
| 2006/0033921 A1 | 2/2006 | Den Boef et al. |
| 2006/0066855 A1 | 3/2006 | Den Boef et al. |
| 2007/0047799 A1* | 3/2007 | Isomura ................. G06T 7/001 |
| | | 382/147 |

(Continued)

FOREIGN PATENT DOCUMENTS

| | | |
|---|---|---|
| JP | H08236427 | 9/1996 |
| JP | 2012160521 | 8/2012 |

(Continued)

OTHER PUBLICATIONS

Taiwanese Office Action issued in corresponding Taiwanese Patent Application No. 109115071, dated Oct. 28, 2021.

(Continued)

*Primary Examiner* — Mesfin T Asfaw
(74) *Attorney, Agent, or Firm* — Pillsbury Winthrop Shaw Pittman, LLP

(57) ABSTRACT

A lithographic apparatus and associated method of controlling a lithographic process. The lithographic apparatus has a controller configured to define a control grid associated with positioning of a substrate within the lithographic apparatus. The control grid is based on a device layout, associated with a patterning device, defining a device pattern which is to be, and/or has been, applied to the substrate in a lithographic process.

20 Claims, 6 Drawing Sheets

(56) References Cited

U.S. PATENT DOCUMENTS

| | | |
|---|---|---|
| 2010/0201963 A1 | 8/2010 | Cramer et al. |
| 2011/0027704 A1 | 2/2011 | Cramer et al. |
| 2011/0043791 A1 | 2/2011 | Smilde et al. |
| 2011/0102753 A1 | 5/2011 | Van De Kerkhof et al. |
| 2012/0044470 A1 | 2/2012 | Smilde et al. |
| 2012/0123581 A1 | 5/2012 | Smilde et al. |
| 2013/0258310 A1 | 10/2013 | Smilde et al. |
| 2013/0271740 A1 | 10/2013 | Quintanilha |
| 2015/0356233 A1 | 12/2015 | Fouquet et al. |
| 2016/0085905 A1* | 3/2016 | Chen .................. G03F 7/70508 716/52 |
| 2016/0148850 A1 | 5/2016 | David |
| 2016/0162626 A1 | 6/2016 | Herrmann et al. |

FOREIGN PATENT DOCUMENTS

| | | |
|---|---|---|
| WO | 2006085626 | 8/2006 |
| WO | 2009078708 | 6/2009 |
| WO | 2009106279 | 9/2009 |
| WO | 2013178422 | 12/2013 |
| WO | 2016096668 | 6/2016 |
| WO | 2016142169 | 9/2016 |

OTHER PUBLICATIONS

International Search Report issued in corresponding PCT Patent Application No. PCT/EP2017/080002, dated Mar. 26, 2018.
Taiwanese Office Action issued in corresponding Taiwanese Patent Application No. 106145713, dated Dec. 28, 2018.
Simiz J-G, et al.: "Product layout induced topography effects on intrafield levelling", Proc. of SPIE, vol. 9661 Sep. 4, 2015.
Chinese Office Action issued in corresponding Chinese Patent Application No. 2017800816914.4, dated Nov. 4, 2020.
Japanese Office Action issued in corresponding Japanese Patent Application No. 2019-527339, dated Jun. 8, 2020.
Japanese Office Action issued in corresponding Japanese Patent Application No. 2021-168507, dated Oct. 14, 2022.

* cited by examiner

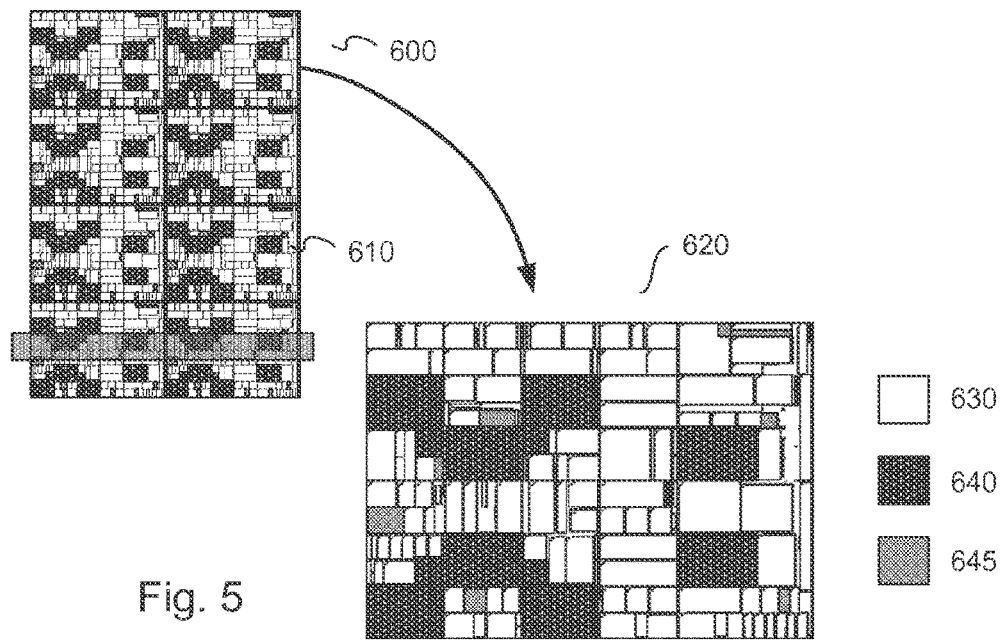
Fig. 5
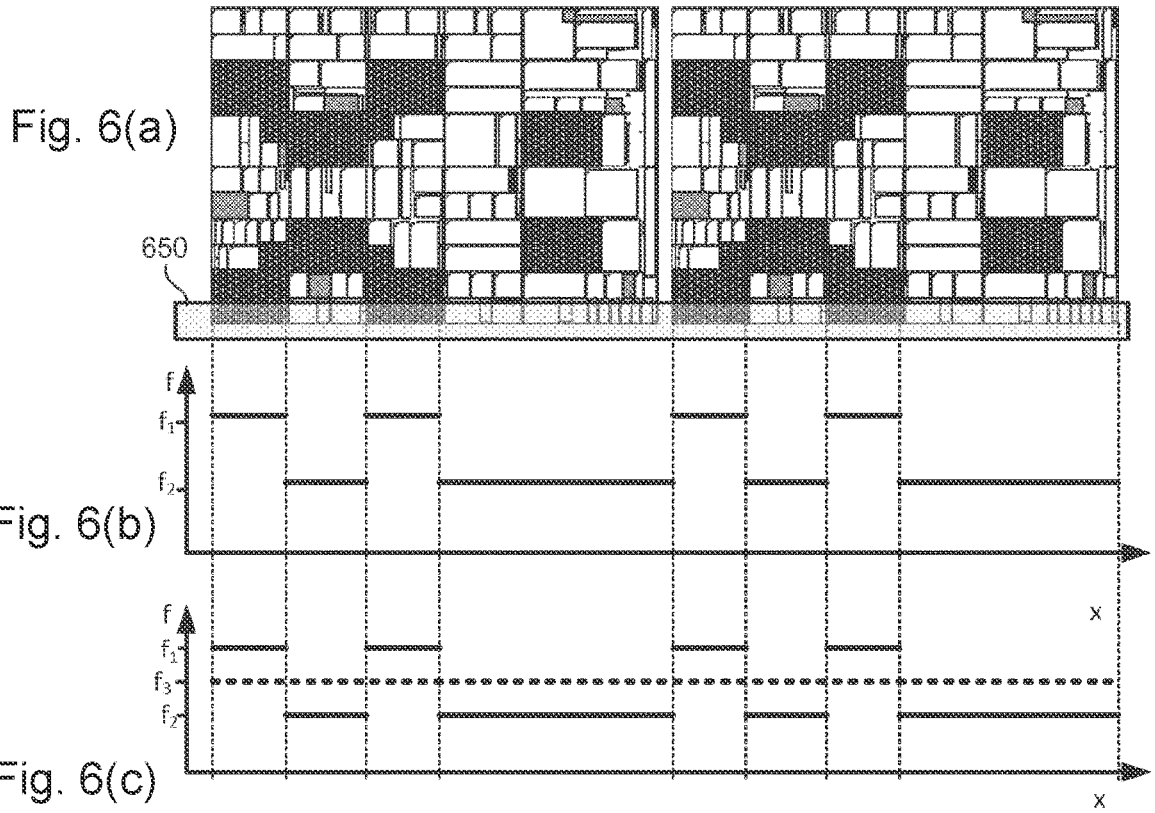
Fig. 6(a)
Fig. 6(b)
Fig. 6(c)

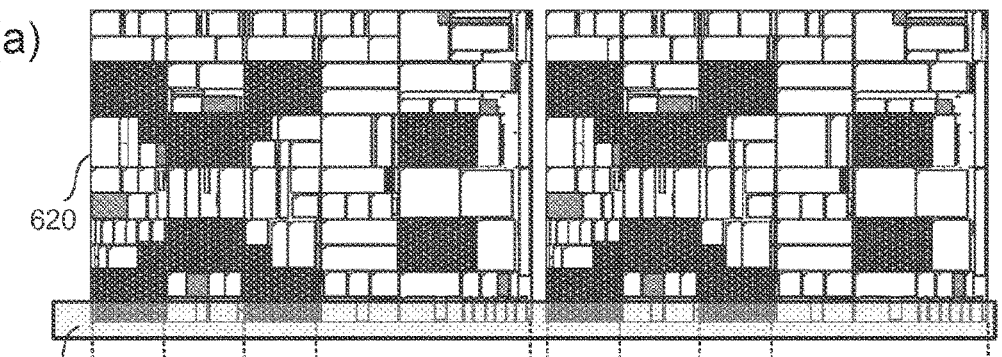
Fig. 7(a)
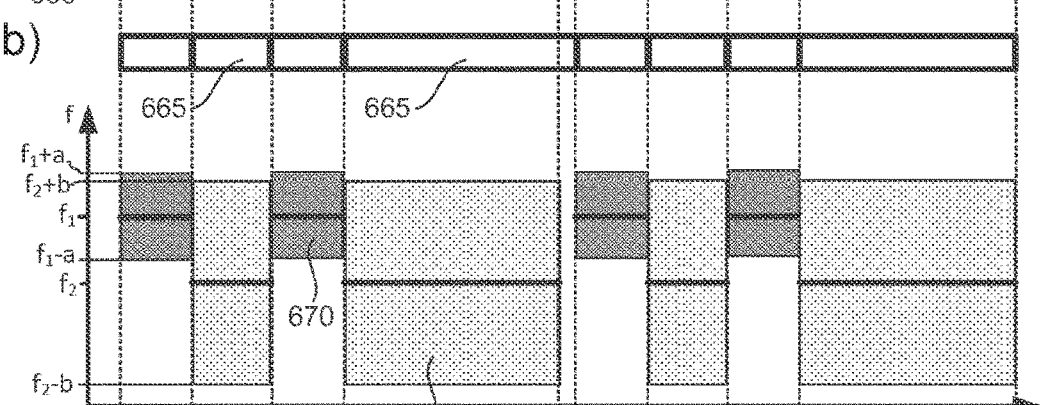
Fig. 7(b)
Fig. 7(c)
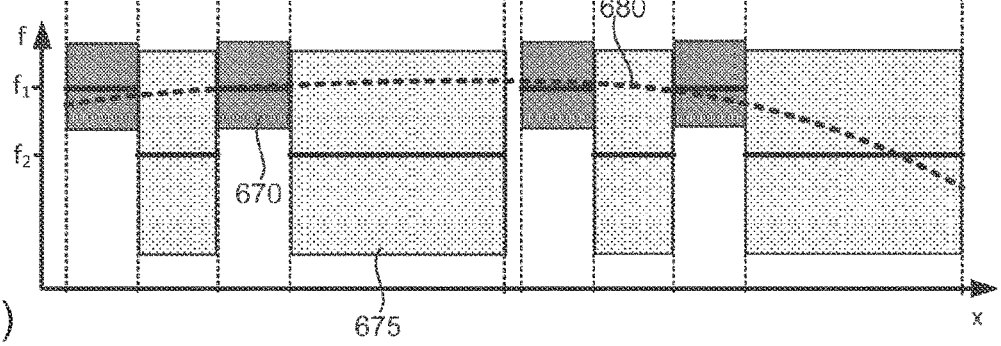
Fig. 7(d)

LITHOGRAPHIC PROCESS AND APPARATUS AND INSPECTION PROCESS AND APPARATUS

This application is a continuation of U.S. patent application Ser. No. 16/468,304, which was filed on Jun. 11, 2019, which is the U.S. national phase entry of PCT Patent Application No. PCT/EP2017/080002, which was filed on Nov. 22, 2017, which claims the benefit of priority of European Patent Application No. 16207472.8, which was filed on Dec. 30, 2016, each of the foregoing applications is incorporated herein in its entirety by reference.

FIELD

The present invention relates to methods and apparatus for applying patterns to a substrate in a lithographic process and/or measuring the patterns.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth (CD) of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Examples of known scatterometers include angle-resolved scatterometers of the type described in U.S. Patent Application Publication Nos. US2006033921 and US2010201963. The targets used by such scatterometers are relatively large, e.g., 40 µm by 40 µm, gratings and the measurement beam generates a spot that is smaller than the grating (i.e., the grating is underfilled). In addition to measurement of feature shapes by reconstruction, diffraction-based overlay can be measured using such apparatus, as described in U.S. Patent Application Publication No. US2006066855. Diffraction-based overlay metrology using dark-field imaging of the diffraction orders enables overlay measurements on smaller targets. Examples of dark field imaging metrology can be found in PCT Patent Application Publication Nos WO 2009/078708 and WO 2009/106279, which are hereby incorporated in their entireties by reference. Further developments of the technique have been described in U.S. Patent Application Publication Nos. US20110027704, US20110043791, US2011102753, US20120044470, US20120123581, US20130258310, US20130271740 and PCT Patent Application Publication No. WO2013178422. These targets can be smaller than the illumination spot and may be surrounded by product structures on a wafer. Multiple gratings can be measured in one image, using a composite grating target. The contents of all these published applications are incorporated herein in their entireties by reference.

In performing lithographic processes, such as application of a pattern on a substrate or measurement of such a pattern, process control methods are used to monitor and control the process. Such process control techniques are typically performed to obtain corrections for across-substrate (inter-field) and within field (intrafield) process fingerprints. It would be desirable to improve such process control methods.

SUMMARY

In an aspect, there is provided a lithographic apparatus comprising: a controller configured to define a control grid associated with positioning of a substrate within the lithographic apparatus, wherein the control grid is based on a device layout, associated with a patterning device, defining a device pattern which is to be, and/or has been, applied to the substrate in a lithographic process.

In an aspect, there is provided a method of controlling a lithographic process comprising defining a control grid associated with positioning of a substrate during the lithographic process, wherein the control grid is based on a device layout, associated with a patterning device, defining a device pattern which is to be, or has been, applied to the substrate.

In an aspect, there is provided a computer program comprising program instructions operable to perform the method of the second aspect when run on a suitable apparatus.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example, with reference to the accompanying drawings in which:

FIG. 5 illustrates an exemplary field and detail of a die therein indicating functional areas;

FIG. 6(a) illustrates part of a field in relation to an exposure slit;

FIG. 6(b) illustrates a plot of best focus values across the exposure slit;

FIG. 6(c) illustrates a plot of FIG. 6(b) with a typical compromise across-slit focus setting also shown;

FIG. 7(a) illustrates part of a field in relation to an exposure slit;

FIG. 7(b) illustrates exemplary control grid elements determined in accordance with an embodiment of the invention;

FIG. 7(c) illustrates a plot of best focus values across the exposure slit and corresponding process windows;

FIG. 7(d) illustrates the plot of FIG. 7(c) with exemplary modelled across-slit focus setting determined in accordance with an embodiment of the invention;

DETAILED DESCRIPTION

Before describing embodiments of the invention in detail, it is instructive to present an example environment in which embodiments of the present invention may be implemented.

Figure 1:
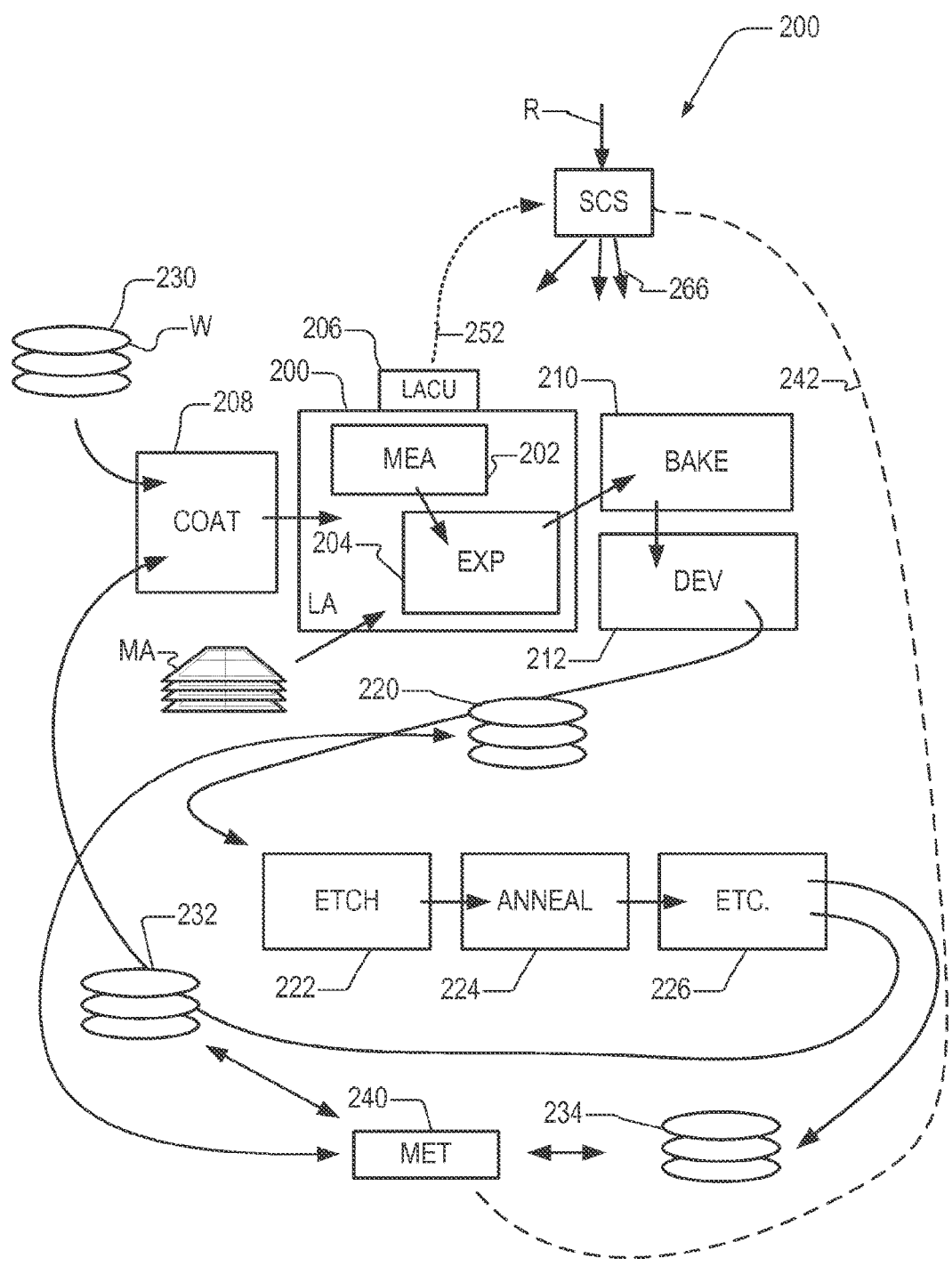
FIG. 1 depicts a lithographic apparatus together with other apparatuses forming a production facility for semiconductor devices.

FIG. 1 at 200 shows a lithographic apparatus LA as part of an industrial production facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables and two stations—an exposure station and a measurement station—between which the substrate tables can be exchanged.

Within the production facility, apparatus 200 forms part of a "litho cell" or "litho cluster" that also contains a coating apparatus 208 for applying photosensitive resist and other coatings to substrates W for patterning by the apparatus 200. At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses. As another example, apparatus and processing steps may be provided for the implementation of self-aligned multiple patterning, to produce multiple smaller features based on a precursor pattern laid down by the lithographic apparatus.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 240 which is provided for making measurements of parameters of the products at desired stages in the manufacturing process. A common example of a metrology station in a modern lithographic production facility is a scatterometer, for example a dark-field scatterometer, an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. The metrology results 242 from the apparatus 240 can be used to maintain accurate performance of the patterning operations in the litho cluster, by supervisory control system SCS and/or control unit LACU 206 making small adjustments over time, thereby minimizing the risk of products being made out-of-specification, and requiring re-work.

Additionally, metrology apparatus 240 and/or other metrology apparatuses (not shown) can be applied to measure properties of the processed substrates 232, 234, and incoming substrates 230. The metrology apparatus can be used on the processed substrate to determine important parameters such as overlay or CD.

A metrology apparatus suitable for use in embodiments of the invention is shown in FIG. 2(*a*). A target T and diffracted rays of measurement radiation used to illuminate the target are illustrated in more detail in FIG. 2(*b*). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11

(e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labelled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labelled 'south'. Other modes of illumination are possible by using different apertures. The rest of the pupil plane is desirably dark as any unnecessary light outside the desired illumination mode will interfere with the desired measurement signals.

Figure 2A:
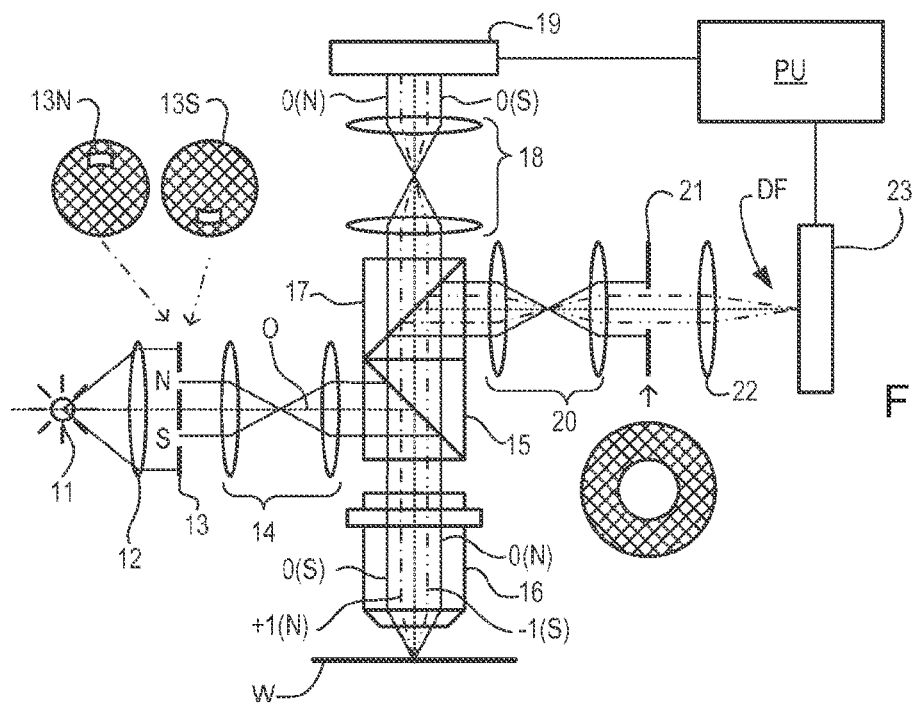
FIGS. 2(a) and 2(b) comprises a schematic diagram of a scatterometer for use in measuring targets according to embodiments of the invention.
Figure 2B:
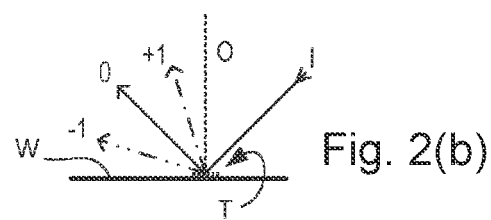

As shown in FIG. 2(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 2(a) and 2(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 2(a), both the first and second illumination modes are illustrated, by designating diametrically opposite apertures labelled as north (N) and south (S). When the incident ray I of measurement radiation is from the north side of the optical axis, that is when the first illumination mode is applied using aperture plate 13N, the +1 diffracted rays, which are labelled +1(N), enter the objective lens 16. In contrast, when the second illumination mode is applied using aperture plate 13S the −1 diffracted rays (labelled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for many measurement purposes such as reconstruction used in methods described herein. The pupil plane image can also be used for focusing the metrology apparatus and/or normalizing intensity measurements of the first order beam.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 2 are purely examples. In another embodiment of the invention, on-axis illumination of the targets is used and an aperture stop with an off-axis aperture is used to pass substantially only one first order of diffracted light to the sensor. In yet other embodiments, $2^{nd}$, $3^{rd}$ and higher order beams (not shown in FIG. 2) can be used in measurements, instead of or in addition to the first order beams.

The target T may comprise a number of gratings, which may have differently biased overlay offsets in order to facilitate measurement of overlay between the layers in which the different parts of the composite gratings are formed. The gratings may also differ in their orientation, so as to diffract incoming radiation in X and Y directions. In one example, a target may comprise two X-direction gratings with biased overlay offsets +d and −d, and Y-direction gratings with biased overlay offsets +d and −d. Separate images of these gratings can be identified in the image captured by sensor 23. Once the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process Various techniques may be used to improve the accuracy of reproduction of patterns onto a substrate. Accurate reproduction of patterns onto a substrate is not the only concern in the production of ICs. Another concern is the yield, which generally measures how many functional devices a device manufacturer or a device manufacturing process can produce per substrate. Various approaches can be employed to enhance the yield. One such approach attempts to make the production of devices (e.g., imaging a portion of a design layout onto a substrate using a lithographic apparatus such as a scanner) more tolerant to perturbations of at least one of the processing parameters during processing a substrate, e.g., during imaging of a portion of a design layout onto a substrate using a lithographic apparatus. The concept of overlapping process window (OPW) is a useful tool for this approach. The production of devices (e.g., ICs) may include other steps such as substrate measurements before, after or during imaging, loading or unloading of the substrate, loading or unloading of a patterning device, positioning of a die underneath the projection optics before exposure, stepping from one die to another, etc. Further, various patterns on a patterning device may have different process windows (i.e., a space of processing parameters under which a pattern will be produced within specification). Examples of pattern specifications that relate to a potential systematic defect include checks for necking, line pull back, line thinning, CD, edge placement, overlapping, resist top loss, resist undercut and/or bridging. The process window of all or some (usually patterns within a particular area) of the patterns on a patterning device may be obtained by merging (e.g., overlapping) process windows of each individual pattern. The process window of these patterns is thus called an overlapping process window. The boundary of the OPW may contain boundaries of process windows of some of the individual patterns. In other words, these individual patterns limit the OPW. These individual patterns can be referred to as "hot spots" or "process window limiting patterns (PWLPs)," which are used interchangeably herein. When controlling a lithography process, it is possible, and typically economical, to focus on the hot spots. When the hot spots are not defective, it is likely that all the patterns are not defective. The imaging becomes more tolerant to perturbations when values of the processing parameters are closer to the OPW if the values of the processing parameters are outside the OPW, or when the values of the processing parameters are farther away from the boundary of the OPW if the values of the processing parameters are inside the OPW.

Figure 3:
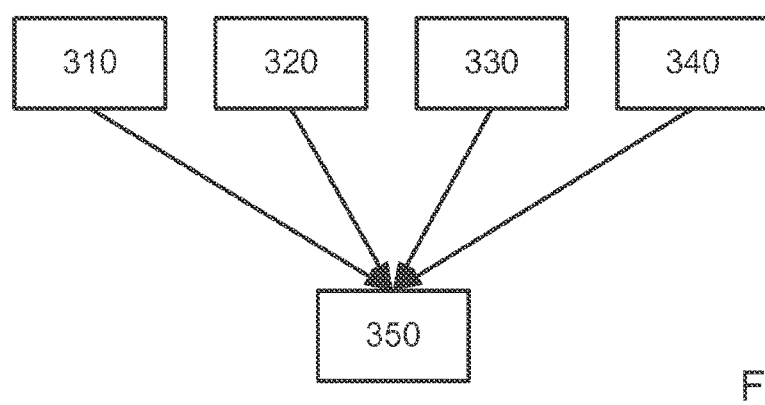
FIG. 3 shows exemplary sources of processing parameters.

FIG. 3 shows exemplary sources of processing parameters 350. One source may be data 310 of the processing apparatus, such as parameters of the source, projection optics, substrate stage, etc. of a lithography apparatus, of a track, etc. Another source may be data 320 from various substrate metrology tools, such as a substrate height map, a focus map, a critical dimension uniformity (CDU) map, etc. Data 320 may be obtained before the applicable substrate was subject to a step (e.g., development) that prevents reworking of the substrate. Another source may be data 330 from one or more patterning device metrology tools, patterning device CDU map, patterning device (e.g., mask) film stack parameter variation, etc. Yet another source may be data 340 from an operator of the processing apparatus.

Figure 4:
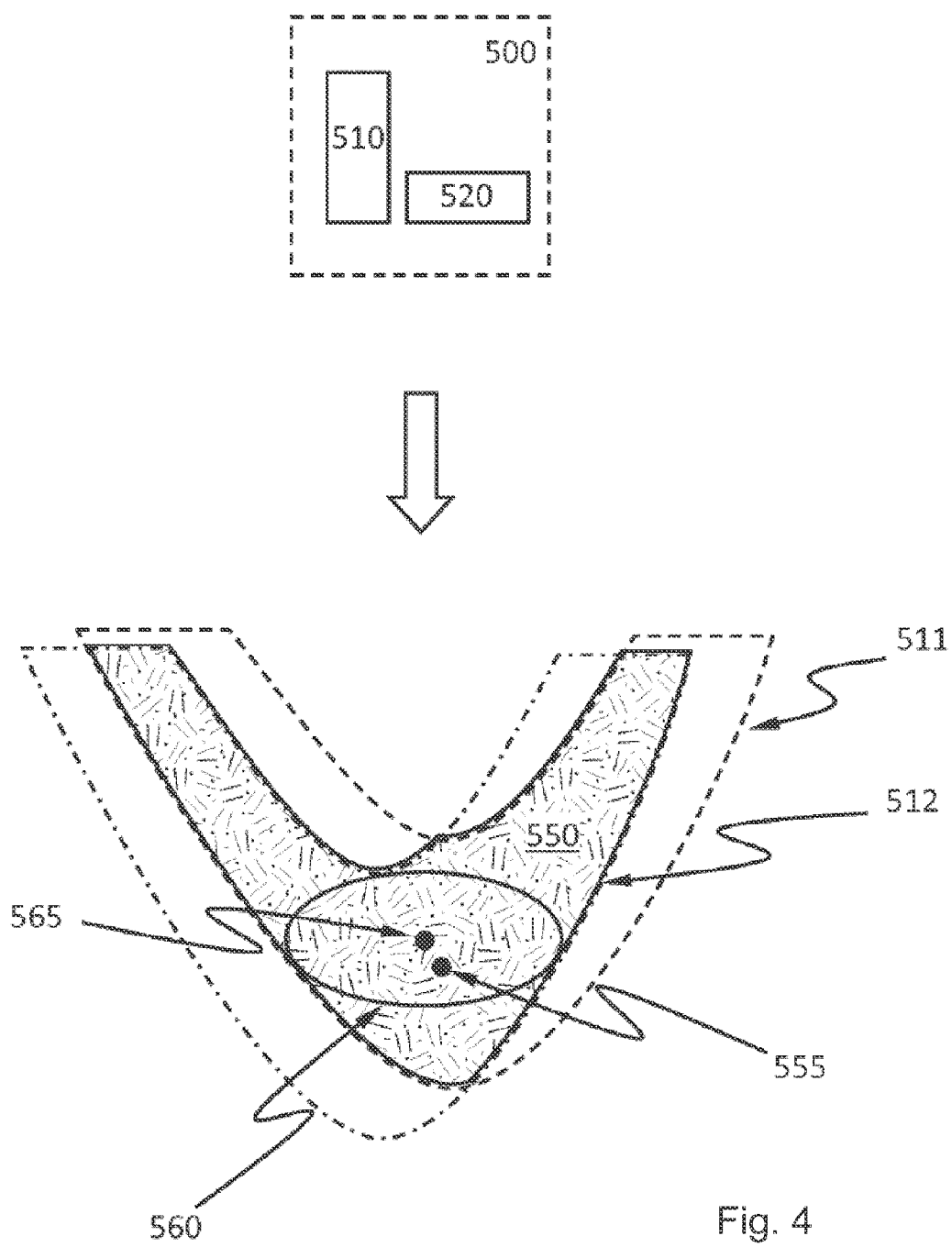
FIG. 4 schematically illustrates a concept of an overlapping process window (OPW)

FIG. 4 schematically illustrates the concept of an OPW. To illustrate the concept, an area, or grid element/pixel, 500 on the patterning device is assumed to have only two individual patterns 510 and 520. The area may include many more patterns. The process windows for the individual patterns 510 and 520 are 511 and 512, respectively. To illustrate the concept, the processing parameters are assumed to only include focus (horizontal axis) and dose (vertical axis). The processing parameters may however include any suitable parameters. The OPW 550 of the area can be obtained by finding the overlap between process windows 511 and 512. The OPW 550 is represented as the hatched area in FIG. 4. The OPW 550 can have an irregular shape. However, in order to easily represent the OPW and to easily determine whether a set of processing parameter values are within the OPW, a "fitted OPW" (e.g., ellipse 560) may be used instead. The "fitted OPW" can be, for example, the largest hyperellipsoid (e.g., ellipse in 2-dimensional processing parameter space as in this example, ellipsoid 3-dimensional processing parameter space, etc.) that fits inside the OPW. Using the "fitted OPW" tends to reduce the computational cost but does not take advantage of the full size of the OPW.

The values of the processing parameters may be selected such that they stay away from the boundary of the OPW or the fitted OPW, in order to decrease the chance that the processing parameters shift outside the OPW and thereby cause defects and decrease the yield. One approach of selecting the values of the processing parameters includes, before actual imaging, (1) optimizing the lithographic apparatus (e.g., optimizing the source and projection optics) and optimizing the design layout, (2) determining the OPW or fitted OPW (e.g., by simulation), and (3) determining a point in the space of the processing parameters (i.e., determining the values of the processing parameters) that is as far away as possible from the boundary of the OPW or fitted OPW (this point may be called the "center" of the OPW or fitted OPW). In the example of FIG. 4, point 555 is the point in the processing parameter space that is as far away as possible from the boundary of the OPW 550 and point 565 is the point in the processing parameter space that is as far away as possible from the boundary of the fitted OPW 560. Point 555 and point 565 may be referred to as the nominal condition. During or before imaging, if the processing parameters shift away from point 555 or point 565, towards the boundary of the OPW or even to the outside the boundary of the OPW, it would be beneficial to have the capability of realizing such a shift and to make appropriate corrections to put the processing parameters back into the OPW and away from its boundary, desirably without interrupting the imaging or other processing.

During or before the actual imaging, the processing parameters may have a perturbation that causes them to deviate from the point that is as far away as possible from the boundary of the OPW or fitted OPW. For example, the focus may change due to topography of a substrate to be exposed, drift in the substrate stage, deformation of the projection optics, etc.; the dose may change to due drift in the source intensity, dwell time, etc. The perturbation may be large enough to cause processing parameters to be outside the OPW, and thus may lead to defects. Various techniques may be used to identify a processing parameter that is perturbed and to correct that processing parameter. For example, if the focus is perturbed, e.g., because an area of the substrate that is slightly raised from the rest of the substrate is being exposed, the substrate stage may be moved or tilted to compensate for the perturbation.

Control of the lithographic process are typically based on measurements fed back or fed forward and then modelled using, for example interfield (across-substrate fingerprint) or intrafield (across-field fingerprint) models. Therefore modelling is limited to no better resolution than field fingerprint control, where a typical field may comprise 8 dies, for example. At present, process control at a sub-die level is not performed. Within a die, there may be separate functional areas such as memory areas, logic areas, contact areas etc. Each different functional area, or different functional area type may have a different process window, each with a different processes window center. For example, different functional area types may have different heights, and therefore different best focus settings. Also, different functional area types may have different structure complexities and therefore different focus tolerances (focus process windows) around each best focus. However, each of these different functional areas will typically be formed using the same focus (or dose or position etc.) setting due to control grid resolution limitations.

Present intrafield models will usually be based upon a fixed, regular control grid and therefore corrections will be limited to the resolution defined by such a grid (e.g., at the level of a grid element 500). Each grid element may comprise different functional areas, or parts thereof, leading to sub-optimal control. Therefore the OPW for each grid element may be the result of different functional areas. However, OPWs are essentially defined per functional area (e.g., a logic area has a different OPW/depth of focus than an SRAM area). Also, the OPW center (e.g., best focus BF/best dose BE) is defined per functional area. In addition, it is expected that features, and therefore specific hot spots, occur per each functional e.g., logic area and SRAM may have distinctly different hot spot types.

It is therefore proposed that a priori knowledge of the device layout being applied to the substrate be used in defining the control grid for modelling, predicting, inspecting, positioning and/or correction within a lithographic process. In particular, the control grid may be aligned to a block structure representative of the functional areas within a die, having an associated process window (in terms of, for example: depth of focus, dose/energy range and/or overlay criticality). In this way, the control grid will not extend across multiple functional areas; instead, the grid "snaps" to the boundaries of the functional areas to avoid control being based on an interpolation between different functional areas. Therefore, process control is optimized for delivering the highest probability of all functional areas exposed at in-spec conditions. The functional areas may be defined and differentiated according to their intended function (e.g., memory, logic, scribe lane etc), as these may have different process control requirements (e.g., process window and best parameter value). Alternatively, the functional areas may be actually defined and differentiated according to their known process control requirements (regardless of actual function), such that areas which of different intended function, but broadly similar process control requirements may be considered to be comprised within a single functional area. A hybrid of these methods of defining and differentiating process areas is also possible, taking into account both intended function and known process control requirements.

FIG. 5 shows a field 600 comprising eight dies 610. A detail of one die 620 is shown. This shows different functional areas (as indicated by shading), specifically non-care areas 630, care areas 640 and ignore areas 645. Also shown is the exposure slit 660 of a lithographic apparatus in relation to the field 600. During exposure, all parameters across the exposure slit area each have a fixed setting.

FIG. 6(a) shows the exposure slit 650 in relation to the field during an exposure. Below this FIG. 6(b) is a graph of focus f against slit position x, showing the best focus (focus process window centers) for different areas across the exposure slit 650, specifically for the non-care areas 630 and care areas 640 (there may also be ignore areas 645, for which the focus setting is not important). For each of the care areas 640, the best focus setting is at a first focus setting $f_1$ and for each of the non-care areas 630, the best focus setting is at a second focus setting $f_2$. Below this is shown in FIG. 7(c) the same best focus settings across the exposure slit 650, and also the focus setting $f_3$ (dotted line) which would typically be used to expose that section of the field 600. This is a compromise of the best focus settings $f_1$, $f_2$ within the exposure slit 650 (e.g., an average of these settings).

FIG. 7 illustrates how modelling and control may be based on a control grid defined by functional areas, in this specific example functional areas within the die. Again, an exposure slit 650 is shown FIG. 7(a) in relation to the field (of which only two dies 620 are shown) during an exposure. Below this FIG. 7(b) is shown example a plurality of control grid elements 665, the size and location of which are each selected to correspond to the different functional areas (in particular non-care areas 630 and care areas 640) across the field. This control grid may be based on knowledge of the location and size of specific areas of patterns applied to the substrate, for example from a reticle data file. FIG. 7(c) shows the best focus setting (as shown in FIG. 6(b)), but also with the corresponding process windows 670, 675. The process windows 670 corresponding to the care areas 640 are shown dark shaded and are bounded by focus settings $f_1+a$ and $f_1-a$. The process windows 675 corresponding to the non-care areas 630 are shown light shaded and are bounded by focus settings $f_2+b$ and $f_2-b$. As can be seen, the process windows 670 corresponding to the care areas 640 are much smaller than the process windows 675 corresponding to the non-care areas 630. Also, partly because of the different best focus settings (process window centers) for the care areas 640 and non-care areas 630, the best focus setting $f_2$ of non-care areas 630 is actually outside of the process windows 670 of care areas 640.

FIG. 7(d) shows an example across slit focus setting which may be applied by a focus control method based on the control grid elements 665 and focus windows/focus window centers 670, 675. Such a focus setting can be modelled based on the control grid and process windows (which may be overlapping process windows as described). In an embodiment, each grid element 665 may be assigned a weighting based on the appropriate process window for the corresponding functional area. Then a focus correction 680 may be fitted in an appropriate direction (as shown here, across the exposure slit) which fits to the best focus settings according to the assigned weighting, such that grid elements/functional areas with smaller process windows are given correspondingly greater weight in the fitting. This is illustrated in FIG. 7(d), where the across-slit focus setting 680 is weighted in favor of the best focus settings $f_1$ of care areas 640. In doing this, the focus remains comfortably within the focus windows of all the grid elements/functional areas. It should be noted that this concept is not limited to across-slit control/correction. Corrections in all directions can be modelled and/or applied according to a grid defined in accordance with the teaching herein.

There are a number of methods for controlling the lithographic process to alter e.g., focus/dose and/or overlay. These may include tilting the reticle stage and/or wafer stage relative to each other. A curvature to the focus variation (in either direction i.e., including across the exposure slit as shown) may be introduced via the projection lens optics (e.g., a lens manipulator), and (in the scan direction) by varying the relative tilt of reticle stage to wafer stage during exposure. Such methods and others will be readily apparent to the skilled person and will not be discussed further.

While the above example shows the control grid being fully aligned with the functional areas, this is not necessary. The concepts described herein include any determination of a control grid which takes into account known layout information, and more specifically layout information which includes and/or is related to a criticality metric (process window) per area. Other embodiments may comprise not necessarily defining control grid elements according to each different functional area, but ensuring only that there are no single grid elements which cover two or more functional areas (or parts thereof) having different process windows and/or best parameter settings, and more specifically where the two or more functional areas have significantly (or very) different process windows and/or best parameter settings. In other words, the grid boundaries may be snapped to areas where there is a large criticality transition (difference in process windows and/or best parameter settings), such that such transitions are not within a grid element, but between grid elements, and such that process requirements within each single grid element shows little variation.

The concepts described herein may also comprise hot spot modelling per functional area such that hot spot lists are defined per functional area. Optical proximity modelling or etch modelling per functional area is also possible. Any grid based modelling for which the grid can be beneficially adjusted/defined in accordance with layout information (position and size of functional areas) falls within the scope of this disclosure. Particularly with hot spot modelling, using such a functional area-based control grid will result in a significantly smaller feature set and therefore a correspondingly lower computational burden. With highly repetitive areas (e.g., SRAM), the feature set almost becomes clip-based. As such, CHD (Computational Hotspot Detection) and/or LMC (Lithographic Manufacturing Check) modelling run-time can be much improved if CHD modelling is performed only for critical areas (e.g., a sub-set of features, a sub-set of die area). LMC is a full-chip verification which can highlight critical patterns in the field before the reticle is produced. Setup of a CHD/LMC model can be focused on the most critical areas: as a result model calibration complexity can be reduced enormously (e.g., calibrate only for particular functional areas such as only SRAM features or only logic). Control is possible on this level: only one focus/dose/overlay offset can be used, so co-optimization basically comprises targeting (e.g., finding best focus/best dose/best overlay).

By way of specific example, consider 3D-NAND fabrication. The large stack used in the 3D-NAND process induces a very large stress. This stress manifests itself both at wafer level (causing severe wafer warp) as well as at die level. At die level, the overlay fingerprint comprises a magnification inside each die. Since there are multiple dies within an exposure field, the resultant field overlay fingerprint exhibits a saw tooth pattern (typically at a scale of tens of nm). Depending on the orientation of the device, the pattern can either be through-slit or through-scan. Regardless of the orientation, the overlay cannot be corrected with available models and actuators (such as iHOPC-Intrafield High Order Process Correction). Such available models have at most, $3^{rd}$-order correction capability, while the "saw tooth" pattern fingerprint is of a much higher order. Correcting for this effect on the reticle (either during reticle writing or reticle correction) is ineffective as there is a field-to-field variation in the overlay fingerprint of the same order of magnitude as the fingerprint itself.

In this embodiment, it is therefore proposed that the control grid comprises a dense control grid (by way of example, a 13×19 interface) to feed the corrections to the lithographic apparatus (scanner). The control grid may be based on the die layout within the exposure field. This may include, for example:
- the number of dies in x and y direction;
- the size of the die in x and y direction;
- the size of functional areas having low criticality (large process windows). These may comprise 'ignore areas' where the overlay is not critical; and/or
- the displacement of the critical features in y-direction.

The grid may therefore be defined such that each individual grid element comprises no more than one die, and that (at least some) grid lines coincide with the ignore areas, for example. A suitable model can then be fitted using the input data according to the control grid. The model can be used to determine process control corrections, for example in terms of wafer stage and/or reticle stage positioning corrections and/or projections system lens corrections. In an embodiment, the model may be a spline model which is used to determine/modify the actuation of one or both of reticle stage and wafer stage movements (and therefore their relative acceleration profile).

The modified acceleration profile may be such that the reticle stage and wafer stage actuation displaces the grid points to the desired locations which correct for the fingerprint pattern. The ignore areas can be used to reset the stage movements (the distance between the min-max overlay values of the saw tooth profiles—see FIG. 8). The resulting wafer-stage and reticle-stage setpoints are checked against their actuation limits before finally applied on the substrate. Such an interface, together with the spline actuation, could reduce the overlay by approximately 90%.

Figure 8:
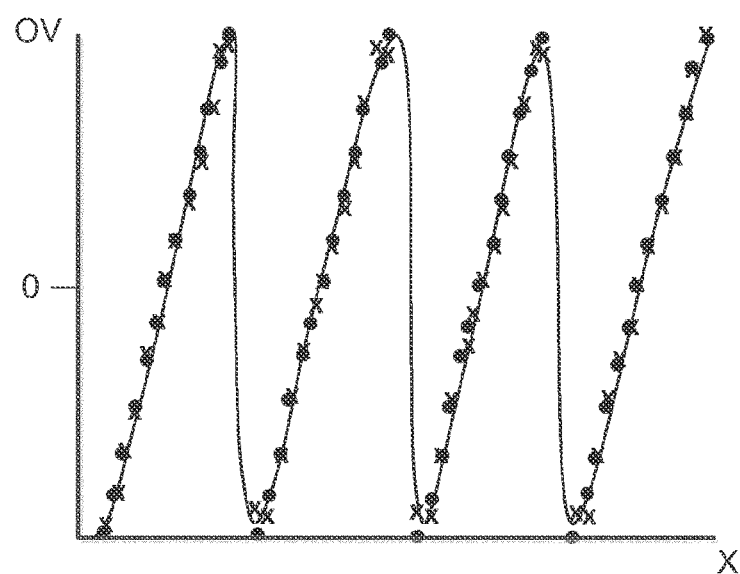
FIG. 8 is a graph of overlay against field position, showing measured overlay; and a fitted correction modeled and/or implemented using a control grid determined by a method according to an embodiment of the invention.

FIG. 8 is a graph of overlay OV (y-axis) against direction X (or Y). Each cross represents a measured overlay value, and each dot is a corresponding compensating correction. The fitted line is the correction profile (modified acceleration profile), which is fitted to the corrections (dots). The saw tooth pattern exhibited in the overlay fingerprint is evident; each section through which the overlay varies substantially linearly with X being a single die (the graph representing overlay measurements across 4 dies). The correction profile follows (and therefore compensates for) the overlay fingerprint.

While this embodiment is described specifically in terms of overlay caused by intra-die stress in the 3D-NAND process, it can be used to correct any other higher-order overlay or focus fingerprint in the scan direction.

While the description up to now has described the concept in terms of corrections in the process control for applying patterns on a substrate using lithographic methods (e.g., scanner control), the concepts are equally applicable to process control of an inspection process; e.g., where the lithographic apparatus is a metrology device (such as that illustrated in FIG. 2 or an electron beam metrology device for example) operable to perform measurements of applied patterns on a substrate. By basing the control grid in an inspection process on known layout information, it becomes possible to perform inspection per functional block on the substrate. This can take advantage of the observation that similar functional areas behave similarly, and therefore there is no need to inspect the same functional area multiple times. This means expensive redundant measurement time can be avoided, which is particularly advantageous for electron beam measurements. Specifically, for example, it is likely that a particular hot spot type would occur many times in a functional block. It is also likely that there will be a single focus/dose/overlay error per functional block. Therefore in an embodiment, only one or a small number of such measurements per functional block are made. In an embodiment, a control grid can be determined for a particular device layout which can be used in both the lithographic patterning process (i.e., by the scanner) in a control step and in a monitoring process (i.e., by a metrology device) is a monitoring step, as part of an integrated monitoring and control process.

Also, by measuring sufficient occurrences per hot spot type (i.e., sampling a sufficient number of hotspots to be statistically significant), it is possible to predict a (normalized) defect probability per hot spot type per functional area; for example for a functional area that is predicted to be out-of-spec. From this, a verified defect density (i.e., a percentage of hotspots measured that actually are defects) can be determined. This could also take into account the impact of local CD uniformity if local CD uniformity measurement data is included.

Figure 9:
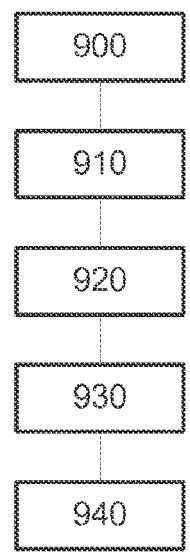
FIG. 9 is a flowchart describing a method according to an embodiment of the invention.

FIG. 9 is a flowchart of a method according to an embodiment of the methods described herein. At step 900, layout information is obtained regarding the position and/or size of functional areas within a die and/or field. This may come, for example, from a reticle data file. At step 910, by measurement, or otherwise (e.g., modelling or a priori knowledge), a best parameter setting of one or more parameters of interest (e.g., focus, dose and/or position/overlay), and a corresponding criticality metric are determined or obtained for each (or some of) the functional areas. The criticality metric may be a process window or OPW. A control grid will then be devised (step 920) based upon the layout information. The control grid may be such that regions of large transition between best parameter setting and/or criticality metric are avoided/not included within a single grid element. In an embodiment, the grid elements may align with the functional area layout, such that each grid element is defined by a separate functional area. At step 930, a control correction or control profile will be devised based on the control grid and (where appropriate) the corresponding best parameter settings and criticality metrics. Where the method relates to a lithographic process for patterning a substrate, the control correction may be a correction in positioning of a substrate with respect to the reticle in the x/y direction (overlay correction), in the z direction (focus correction) or a dose correction, for example. Where the method relates to a metrology process, the control profile may be such that only one or a few measurements are performed per functional area, for example. Finally, at step 940 the control correction/control profile will be applied by a lithographic apparatus (e.g., scanner or metrology device) when performing a lithographic process, (e.g., applying a pattern or performing measurements).

Definition of the control grid may be provided by a controller within the lithographic apparatus. The controller is configured to receive device layout data, based on reticle data or alternatively on measurements associated with processed substrates comprising patterns according to the device layout. The controller is further configured to identify different functional areas associated with an operational device.

Although patterning devices in the form of a physical reticle have been described, the term "patterning device" in this application also includes a data product conveying a pattern in digital form, for example to be used in conjunction with a programmable patterning device.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used in relation to the lithographic apparatus encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

Further embodiments of the invention are disclosed in the list of numbered embodiments below:

1. A lithographic apparatus comprising:
a controller configured to define a control grid associated with positioning of a substrate within the lithographic apparatus, wherein the control grid is based on a device layout, associated with a patterning device, defining a device pattern which is to be, and/or has been, applied to the substrate in a lithographic process.

2. A lithographic apparatus according to embodiment 1, wherein the device layout is obtained from reticle data related to the patterning device used to apply a pattern during the lithographic process.

3. A lithographic apparatus according to embodiment 1 or 2, being operable to identify different functional areas from the device layout and base the control grid on the identified different functional areas, wherein the different functional areas differ in their function when part of an operational device.

4. A lithographic apparatus according to embodiment 3, wherein the functional areas comprise at least some functional areas smaller than and within a die.

5. A lithographic apparatus according to embodiment 3 or 4, wherein the number of control grid elements which comprise a boundary between different functional areas within the control grid element is minimized.

6. A lithographic apparatus according to embodiment 3, 4 or 5, wherein the control grid is such that there are no control grid elements which comprise a boundary between different functional areas within the control grid element.

7. A lithographic apparatus according to any of embodiments 3 to 6, being operable such that the control grid is determined to align with the device layout such that each individual control grid element corresponds to one of the identified functional areas.

8. A lithographic apparatus according to any of embodiments 3 to 7, wherein the lithographic apparatus comprises a lithographic patterning device for applying a pattern to the substrate.

9. A lithographic apparatus according to embodiment 8, being operable to obtain a best parameter value and associated criticality metric for at least one control parameter related to the lithographic process for each of some or all of the identified functional areas.

10. A lithographic apparatus according to embodiment 9, wherein the functional areas are at least partly defined by the parameter values and associated criticality metrics for each of some or all of the identified functional areas.

11. A lithographic apparatus according to embodiment 9 or 10, wherein the at least one control parameter is one or more of position, focus or dose.

12. A lithographic apparatus according to embodiment 9, 10 or 11, wherein the control parameter relates to control of a substrate stage and/or reticle stage of the lithographic apparatus, thereby controlling the relative position of the substrate stage with respect to the reticle stage.

13. A lithographic apparatus according to embodiment 9, 10 or 11, wherein the control parameter relates to control of a projection system of the lithographic apparatus.

14. A lithographic apparatus according to any of embodiments 9 to 13, wherein the control grid is such that there is little or no variation in the best parameter value and associated criticality metric within each individual control grid element.

15. A lithographic apparatus according to any of embodiments 9 to 14, wherein the criticality metric comprises a process window.

16. A lithographic apparatus according to any of embodiments 9 to 15, wherein the controller is operable to determine a correction for control of the lithographic apparatus based on the control grid.

17. A lithographic apparatus according to embodiment 16, wherein the correction comprises a weighted optimization providing the highest probability that the control parameter satisfies the criticality metric for all relevant functional areas.

18. A lithographic apparatus according to embodiment 16 or 17, wherein the correction comprises a weighted fitting across the functional areas, the weighted fitting comprising a fitting to the best parameter values of the functional areas, the fitting being weighted in favor of best parameter values for which the criticality metric indicates are the most critical.

19. A lithographic apparatus according to any of embodiments 16 to 18, wherein the correction is determined across an exposure slit of the lithographic apparatus.

20. A lithographic apparatus according to any of embodiments 16 to 19, being operable to model the correction using a spline model.

21. A lithographic apparatus according to embodiment 20, wherein the spline model comprises a linear regression for each die across a field in at least one direction.

22. A lithographic apparatus according to any of embodiments 16 to 21, operable to implement the correction in controlling a relative acceleration profile for positioning of the substrate relative to a reticle during an exposure in the lithographic apparatus, the relative acceleration profile defining the physical positioning of one or both of the substrate and the reticle during the exposure.

23. A lithographic apparatus according to any of embodiments 16 to 22, operable to control the lithographic process according to the correction.

24. A lithographic apparatus according to any of embodiments 3 to 7, wherein the lithographic apparatus comprises a metrology device for measuring the device pattern after it is applied to the substrate.

25. A lithographic apparatus according to embodiment 24, wherein the controller is configured to minimize the number of measurements per functional area.

26. A lithographic apparatus according to embodiment 24, wherein the controller is configured to measure a sample number of process window limiting patterns in one or more functional areas and to use this measurement to determine a defect density per process window limiting pattern per functional area.

27. A lithographic apparatus according to any preceding embodiment, wherein the lithographic apparatus comprises a lithographic patterning device for applying a pattern to the substrate and a metrology device for measuring a pattern applied to the substrate, the control grid being used by the lithographic patterning device and the metrology device.

28. A method of controlling a lithographic process comprising defining a control grid associated with positioning of a substrate during the lithographic process, wherein the control grid is based on a device layout, associated with a patterning device, defining a device pattern which is to be, or has been, applied to the substrate.

29. A method according to embodiment 28, wherein the device layout is obtained from reticle data related to the patterning device.

30. A method according to embodiment 28 or 29, comprising identifying different functional areas from the device layout and basing the control grid on the identified different functional areas, wherein the different functional areas differ in their function when part of an operational device.

31. A method according to embodiment 30, wherein the functional areas comprise at least some functional areas smaller than and within a die.

32. A method according to embodiment 30 or 31, wherein the number of control grid elements which comprise a boundary between different functional areas within the control grid element is minimized.

33. A method according to embodiment 30, 31 or 32, wherein the control grid is such that there are no control grid elements which comprise a boundary between different functional areas within the control grid element.

34. A method according to any of embodiments 30 to 33, being operable such that the control grid is determined to align with the layout information such that each individual control grid element corresponds to one of the identified functional areas.

35. A method according to any of embodiments 30 to 34, wherein the lithographic process comprises a lithographic patterning process for applying the device pattern to the substrate.

36. A method according to embodiment 35, comprising obtaining a best parameter value and associated criticality metric for at least one control parameter related to the lithographic process for each of some or all of the identified functional areas.

37. A method according to embodiment 36, wherein the functional areas are at least partly defined by the parameter values and associated criticality metrics for each of some or all of the identified functional areas.

38. A method according to embodiment 36 or 37, wherein the at least one control parameter is one or more of position, focus or dose.

39. A method according to embodiment 36, 37 or 38, wherein the control parameter relates to control of a substrate stage and/or reticle stage of a lithographic apparatus used to perform the lithographic process, thereby controlling the relative position of the substrate stage with respect to the reticle stage.

40. A method according to embodiment 36, 37 or 38, wherein the control parameter relates to control of a projection system of a lithographic apparatus used to perform the lithographic process.

41. A method according to any of embodiments 36 to 40, wherein the control grid is such that there is little or no variation in the best parameter value and associated criticality metric within each individual control grid element.

42. A method according to any of embodiments 36 to 41, wherein the criticality metric comprises a process window.

43. A method according to any of embodiments 36 to 42, wherein comprising determining a correction for control of the lithographic process based on the control grid.

44. A method according to embodiment 43, wherein the correction comprises a weighted optimization providing the highest probability that the control parameter satisfies the criticality metric for all relevant functional areas.

45. A method according to embodiment 43 or 44, wherein the correction comprises a weighted fitting across the functional areas, the weighted fitting comprising a fitting to the best parameter values of the functional areas, the fitting being weighted in favor of best parameter values for which the criticality metric indicates are the most critical.

46. A method according to any of embodiments 43 to 45, wherein the correction is determined across an exposure slit of a lithographic apparatus used to perform the lithographic process.

47. A method according to any of embodiments 43 to 46, wherein the correction is modelled using a spline model.

48. A method according to embodiment 47, wherein the spline model comprises a linear regression for each die across a field in at least one direction.

49. A method according to any of embodiments 43 to 48, operable to implement the correction in controlling a relative acceleration profile for positioning of the substrate relative to a reticle during an exposure of the lithographic process, the relative acceleration profile defining the physical positioning of one or both of the substrate and the reticle during the exposure.

50. A method according to any of embodiments 43 to 49, comprising controlling the lithographic process according to the correction.

51. A method according to any of embodiments 30 to 34, wherein the lithographic process comprises a metrology device for measuring the device pattern after it has been applied to the substrate.

52. A method according to embodiment 51, wherein comprising minimizing the number of measurements per functional area.

53. A method according to embodiment 51, comprising measuring a sample number of process window limiting patterns in one or more functional areas and to use this measurement to determine a defect density per process window limiting pattern per functional area.

54. A computer program comprising program instructions operable to perform the method of any of embodiments 28 to 53 when run on a suitable apparatus.

55. A non-transient computer program carrier comprising the computer program of embodiment 54.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of configuring an inspection apparatus for measuring a pattern applied to a substrate associated with a patterning device, the method comprising:
    identifying different functional areas from a device layout of the patterning device; and
    configuring a control grid of the inspection apparatus based on the identified different functional areas.

2. The method of claim 1, wherein the patterning device is a reticle and the device layout is obtained from reticle data.

3. The method of claim 1, wherein the different functional areas differ in their function when part of an operational device.

4. The method of claim 1, wherein the control grid comprises a plurality of control grid elements and the configuring comprises minimizing a number of control grid elements which comprise a boundary between different functional areas.

5. The method of claim 4, wherein the configuring comprising configuring the control grid to align with the device layout such that each individual control grid element corresponds to a one of the identified functional areas.

6. The method of claim 1, further comprising controlling the inspection apparatus using the control grid to perform measurements.

7. The method of claim 6, wherein the measurements relate to a number of process window limiting patterns in one or more functional areas.

8. The method of claim 7, further comprising using the measurements to determine a defect density per process window limiting pattern per functional area.

9. The method of claim 6, wherein the controlling is further configured to minimize a number of measurements per functional area.

10. The method of claim 1, wherein the functional areas comprise at least some functional areas smaller than and within a die area on the substrate.

11. The method of claim 1, wherein the inspection apparatus is a scatterometer or an electron beam metrology device.

12. An inspection apparatus comprising a controller configured by the control grid obtained by the method according to claim 1.

13. A computer program product comprising a non-transitory computer-readable medium having instructions therein, the instructions, when executed by a computer system, configured to cause the computer system to at least:
    identify different functional areas from a device layout of a patterning device used to apply a pattern to a substrate; and
    configure, based on the identified different functional areas, a control grid of an inspection apparatus for measuring the pattern applied to the substrate.

14. The computer program product of claim 13, wherein the patterning device is a reticle and the instructions are further configured to cause the computer system to obtain the device layout from reticle data.

15. The computer program product of claim 13, wherein the different functional areas differ in their function when part of an operational device.

16. The computer program product of claim 13, wherein the control grid comprises a plurality of control grid elements and the instructions are further configured to cause the computer system to minimize a number of control grid elements which comprise a boundary between different functional areas.

17. The computer program product of claim 16, wherein the instructions are further configured to configure the control grid to align with the device layout such that each individual control grid element corresponds to one of the identified functional areas.

18. The computer program product of claim 13, wherein the instructions are further configured to cause the computer system to control the inspection apparatus to perform measurements using the control grid.

19. The computer program product of claim 18, wherein the instructions configured to cause the computer system to control the inspection apparatus are further configured to minimize a number of measurements per functional area.

20. A computer system comprising:
   the computer program product of claim 13; and
   a processor configured to execute the instructions of the computer program product.

* * * * *